US009613837B2

(12) United States Patent
Senzaki et al.

(10) Patent No.: US 9,613,837 B2
(45) Date of Patent: Apr. 4, 2017

(54) SUBSTRATE PROCESSING APPARATUS AND MAINTENANCE METHOD THEREOF

(71) Applicant: TOKYO ELECTRON LIMITED, Tokyo (JP)

(72) Inventors: Shigeru Senzaki, Miyagi (JP); Michishige Saito, Miyagi (JP); Daiki Satoh, Miyagi (JP); Ken Horiuchi, Miyagi (JP); Koji Ando, Miyagi (JP); Shingo Koiwa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/395,584

(22) PCT Filed: Apr. 1, 2013

(86) PCT No.: PCT/JP2013/059981
§ 371 (c)(1),
(2) Date: Oct. 20, 2014

(87) PCT Pub. No.: WO2013/161519
PCT Pub. Date: Oct. 31, 2013

(65) Prior Publication Data
US 2015/0086302 A1 Mar. 26, 2015

Related U.S. Application Data

(60) Provisional application No. 61/640,766, filed on May 1, 2012.

(30) Foreign Application Priority Data

Apr. 24, 2012 (JP) ................................. 2012-098791

(51) Int. Cl.
*H01L 21/67* (2006.01)
*H01L 21/677* (2006.01)
(Continued)

(52) U.S. Cl.
CPC ..... *H01L 21/67161* (2013.01); *B25J 11/0095* (2013.01); *H01J 37/32091* (2013.01);
(Continued)

(58) Field of Classification Search
CPC ......... H01L 21/67161; H01L 21/67126; H01L 21/6719; H01L 21/67196; H01L 21/67703;
(Continued)

(56) References Cited

U.S. PATENT DOCUMENTS 6,719,851 B1 * 4/2004 Kurita ................. C23C 16/4407
118/715
7,780,391 B2 * 8/2010 Matsuoka ......... H01L 21/67126
414/217
(Continued)

FOREIGN PATENT DOCUMENTS

JP 2007-150108 A 6/2007
JP 2007165659 A * 6/2007

OTHER PUBLICATIONS

International Search Report mailed Jun. 18, 2013 in PCT/JP2013/059981.

*Primary Examiner* — Kaitlin Joerger
(74) *Attorney, Agent, or Firm* — Rothwell, Figg, Ernst & Manbeck, P.C.

(57) ABSTRACT

A substrate processing apparatus includes: a first processing chamber; a second processing chamber; a transfer chamber; a frame structure; and an elevating part. Each of the first and the second processing chamber has a main body part and a lid part. The transfer chamber is connected to the first and the second processing chamber and accommodates a transfer unit for transferring the substrate. The frame structure has a pair of column parts and a beam part supported at top portions of the column parts. The elevating part is coupled to the beam part to be moved in a horizontal direction and
(Continued)

moves the lid part in the vertical direction. The beam part extends above the first and the second processing chamber and the transfer chamber.

17 Claims, 9 Drawing Sheets

(51) Int. Cl.
 *H01J 37/32* (2006.01)
 *B25J 11/00* (2006.01)

(52) U.S. Cl.
 CPC .... *H01J 37/32899* (2013.01); *H01L 21/6719* (2013.01); *H01L 21/67126* (2013.01); *H01L 21/67196* (2013.01); *H01L 21/67703* (2013.01); *H01L 21/67733* (2013.01); *H01L 21/67736* (2013.01)

(58) Field of Classification Search
 CPC ......... H01L 21/67733; H01L 21/67736; H01L 21/3065
 USPC .................................................... 414/222.13
 See application file for complete search history.

(56) References Cited

U.S. PATENT DOCUMENTS

| | | | |
|---|---|---|---|
| 7,883,579 B2* | 2/2011 | Kodashima | H01L 21/6719 118/715 |
| 8,075,691 B2* | 12/2011 | Lee | H01L 21/67126 118/715 |
| 2012/0199065 A1* | 8/2012 | Wieting | H01L 21/67173 118/704 |
| 2015/0132084 A1* | 5/2015 | Lingenhol | B23Q 7/1494 414/222.13 |

* cited by examiner

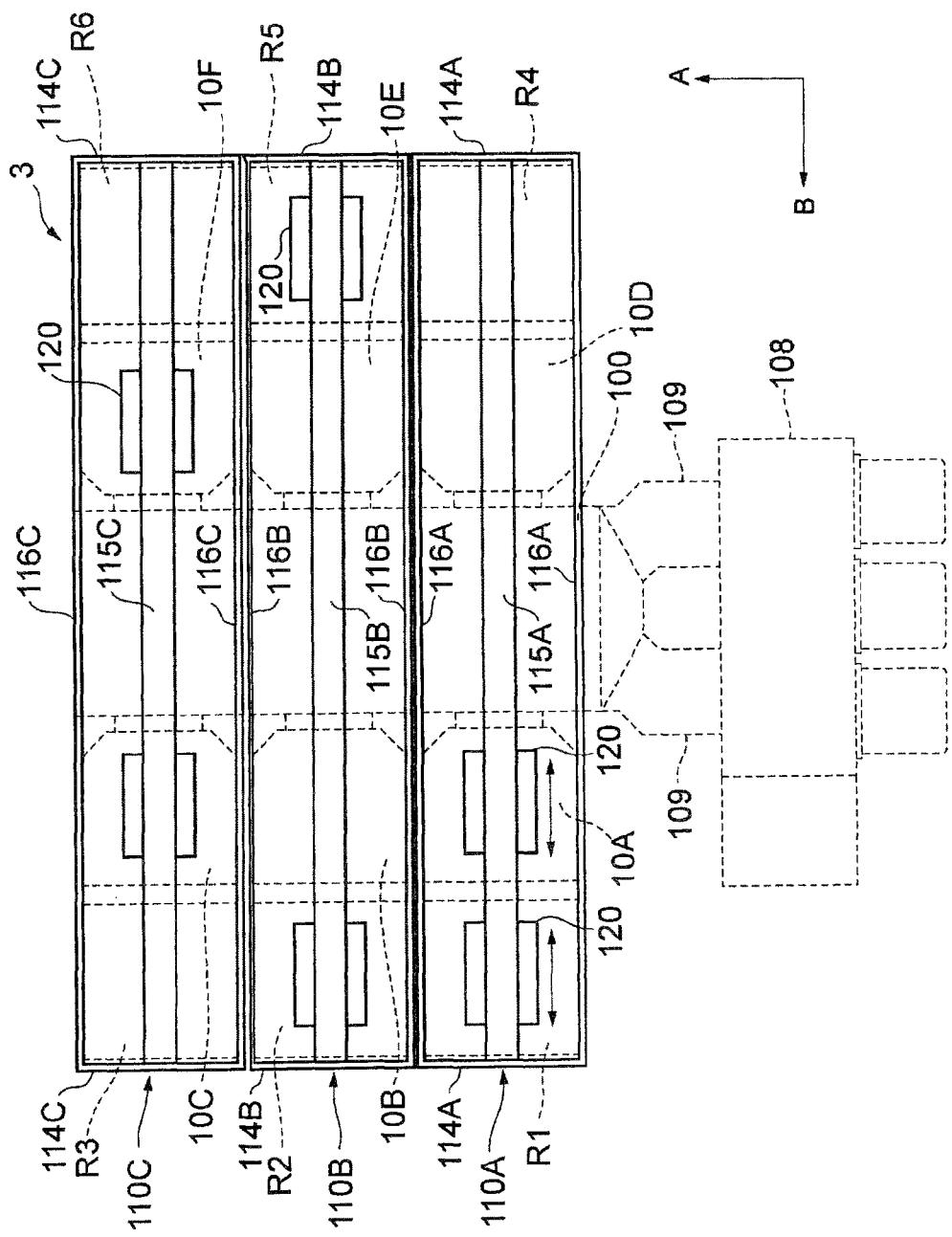

SUBSTRATE PROCESSING APPARATUS AND MAINTENANCE METHOD THEREOF

CROSS REFERENCE TO RELATED APPLICATION

This application is a 35 U.S.C. 371 National Phase Entry Application from PCT/JP2013/059981, filed Apr. 1, 2013, which claims priority to and the benefit of U.S. Provisional Application No. 61/640,766, filed May 1, 2012 and Japanese Patent Application No. 2012-098791, filed Apr. 24, 2012, the disclosures of which are incorporated herein in their entirety by reference.

FIELD OF THE INVENTION

The present invention relates to a substrate processing apparatus and a maintenance method thereof.

BACKGROUND OF THE INVENTION

Conventionally, there is known a substrate processing apparatus including an elevation mechanism for vertically moving a component or the like (see, e.g., Patent Document 1). The substrate processing apparatus disclosed in Patent Document 1 includes a reaction chamber and a heating device. The reaction chamber accommodates a semiconductor substrate. The heating device is provided at an upper portion of the reaction chamber to heat the semiconductor substrate in the reaction chamber. The reaction chamber and the heating device are provided on an approximately same vertical line. Here, the substrate processing apparatus disclosed in Patent Document 1 includes an elevating frame and a sliding device. The elevating frame is vertically movable at a position separated from the reaction chamber in a horizontal direction. The sliding device has a base end portion connected to the elevating frame and a leading end portion connected to the heating device. Further, the sliding device moves the heating device in the horizontal direction toward the elevating frame. During the maintenance operation, the heating device is moved to a position separated from the reaction chamber in a vertical direction by the elevating frame and then moved to a maintenance position separated from the reaction chamber in the horizontal direction by the sliding device.

Patent Document 1: Japanese Patent Application Publication No. 2007-150108

SUMMARY OF THE INVENTION

Meanwhile, in the substrate processing apparatus, a working space where an operator performs a maintenance operation needs to be ensured around a semiconductor device. The working space is ensured near a plurality of processing chambers for processing substrates. The working space is included in an arrangement space of the substrate processing apparatus. Therefore, in the substrate processing apparatus including a plurality of processing chambers, the arrangement space that needs to be ensured tends to be increased. In view of the above, the present invention provides a substrate processing apparatus configured to effectively utilize the arrangement space for the substrate processing apparatus including the working space in the case where a plurality of chambers is provided and a maintenance method thereof.

In accordance with an aspect of the present invention, there is provided a substrate processing apparatus including: a first processing chamber including a main body part, a lid part and a processing space formed in the first processing chamber; a second processing chamber including a main body part, a lid part and a processing space formed in the second processing chamber; a transfer chamber that is connected to the first processing chamber and the second processing chamber and has therein a transfer unit configured to transfer a substrate accommodated in the first processing chamber or the second processing chamber.

The substrate processing apparatus further includes: a frame structure including a pair of column parts and a beam part supported at top portions of the column parts; and at least one elevating part that is coupled to the beam part to be movable in a horizontal direction and is configured to move the lid part in a vertical direction.

The beam part extends across above the first processing chamber, the transfer chamber and the second processing chamber.

In this substrate processing apparatus, the beam part extending across the plurality of chambers is supported by the top portions of the pair of column parts. Therefore, the elevating part for lifting the lid part in the vertical direction can be stably supported. Further, the elevating part is coupled at the beam part to be movable in the horizontal direction, which makes it possible to perform the maintenance operation of the processing chamber by moving the lid part above the transfer chamber, for example. The working space where the operator works includes a region where components such as the lid part and the like are made to stand by. Since the region above the transfer chamber can be utilized as a location where the lid part is made to stand by during the maintenance operation, the arrangement space of the substrate processing apparatus which includes the working space can be effectively used.

A first working space for performing maintenance of the first processing chamber may be provided adjacent to the first processing chamber in an arrangement direction the first processing chamber and the transfer chamber. A second working space for performing maintenance of the second processing chamber may be provided adjacent to the second processing chamber in an arrangement direction of the second processing chamber and the transfer chamber.

The beam part may extend across above the first working space and the second working space. With the above configuration, the elevating part can be move to the region above the first or the second working space and made to standby thereabove, if necessary. Accordingly, the maintenance operation of the lid part can be performed in the working space while utilizing the working space.

The first working space may have an area, when seen from a vertical direction, to the extent that at least the lid part of the first processing chamber is accommodated therein, and the second working space may have an area, when seen from the vertical direction, to the extent that at least the lid part of the second processing chamber is accommodated therein. With such a configuration, the lid part can be reliably made to standby above the working spaces.

The elevating part may be coupled to the beam part to be movable above the transfer chamber and at least one of the first working space and the second working space.

The first processing chamber and the second processing chamber may be arranged opposite to each other with the transfer chamber interposed therebetween. With such a configuration, the elevating part for lifting the lid part in the vertical direction can be stably supported.

The at least one elevating part may include a plurality of elevating parts coupled to the beam part. With such a configuration, the lid part of the first processing chamber and the lid part of the second processing chamber can be simultaneously lifted for an operation, for example.

The substrate processing apparatus may further include an auxiliary elevating part which is coupled to the beam part to be movable in the horizontal direction and is configured to move a component of the processing chamber in the vertical direction. With such a configuration, components in the processing chamber can be unloaded therefrom in a state where the lid part is lifted and made to stand by, for example.

The elevating part may have a connection member to be connected to the lid part and an elevation mechanism for lifting the connection member. Further, the elevating part may have an elevation mechanism which is fixed to the lid part to lift the lid part.

In accordance with another aspect of present invention, there is provided a maintenance method of a substrate processing apparatus, the substrate processing apparatus including: a first processing chamber including a main body part, a lid part and a processing space formed in the first processing chamber; a second processing chamber including a main body part, a lid part and a processing space formed in the second processing chamber; a transfer chamber that is connected to the first processing chamber and the second processing chamber and has therein a transfer unit configured to transfer a substrate accommodated in the first processing chamber or the second processing chamber.

The substrate processing apparatus further includes: a frame structure including a pair of column parts and a beam part supported at top portions of the column parts; and at least one elevating part that is coupled to the beam part to be movable in a horizontal direction and is configured to move the lid part in a vertical direction.

Further, a first working space for performing maintenance of the first processing chamber is provided adjacent to the first processing chamber in an arrangement direction of the first processing chamber and the transfer chamber, and a second working space for performing maintenance of the second processing chamber is provided adjacent to the second processing chamber in an arrangement direction of the second processing chamber and the transfer chamber.

The beam part extends across above the first working space, the first processing chamber, the transfer chamber, the second processing chamber, and the second working space.

The method includes: lifting the lid part of the first processing chamber by the elevating part upon the maintenance of the first processing chamber; and moving the lid part to a region above the transfer chamber in case of the maintenance of the inside of the first processing chamber and moving the lid part to an upper position in the first working space in case of the maintenance of the lid part of the first processing chamber.

In accordance with the above maintenance method, the same effect as that of the above substrate processing apparatus can be obtained.

Effect of the Invention

As described above, in accordance with various aspects and embodiments of the present invention, the arrangement space of the substrate processing apparatus which includes the working space can be effectively utilized.

BRIEF DESCRIPTION OF THE DRAWINGS

FIG. 4 is a top view of the frame structure.

FIGS. 5A and 5B are schematic diagrams for explaining an example of an elevating part, wherein FIG. 5A shows a state before a lid part is lifted and FIG. 5B shows a state in which the lid part is lifted.

FIGS. 6A and 6B are schematic diagrams for explaining a maintenance method, wherein FIG. 6A is a schematic diagram for explaining a moving position of the lid part, and FIG. 6B is a schematic diagram for explaining a case of loading and unloading a component into and from a processing chamber.

DETAILED DESCRIPTION OF THE EMBODIMENTS

Figure 1:
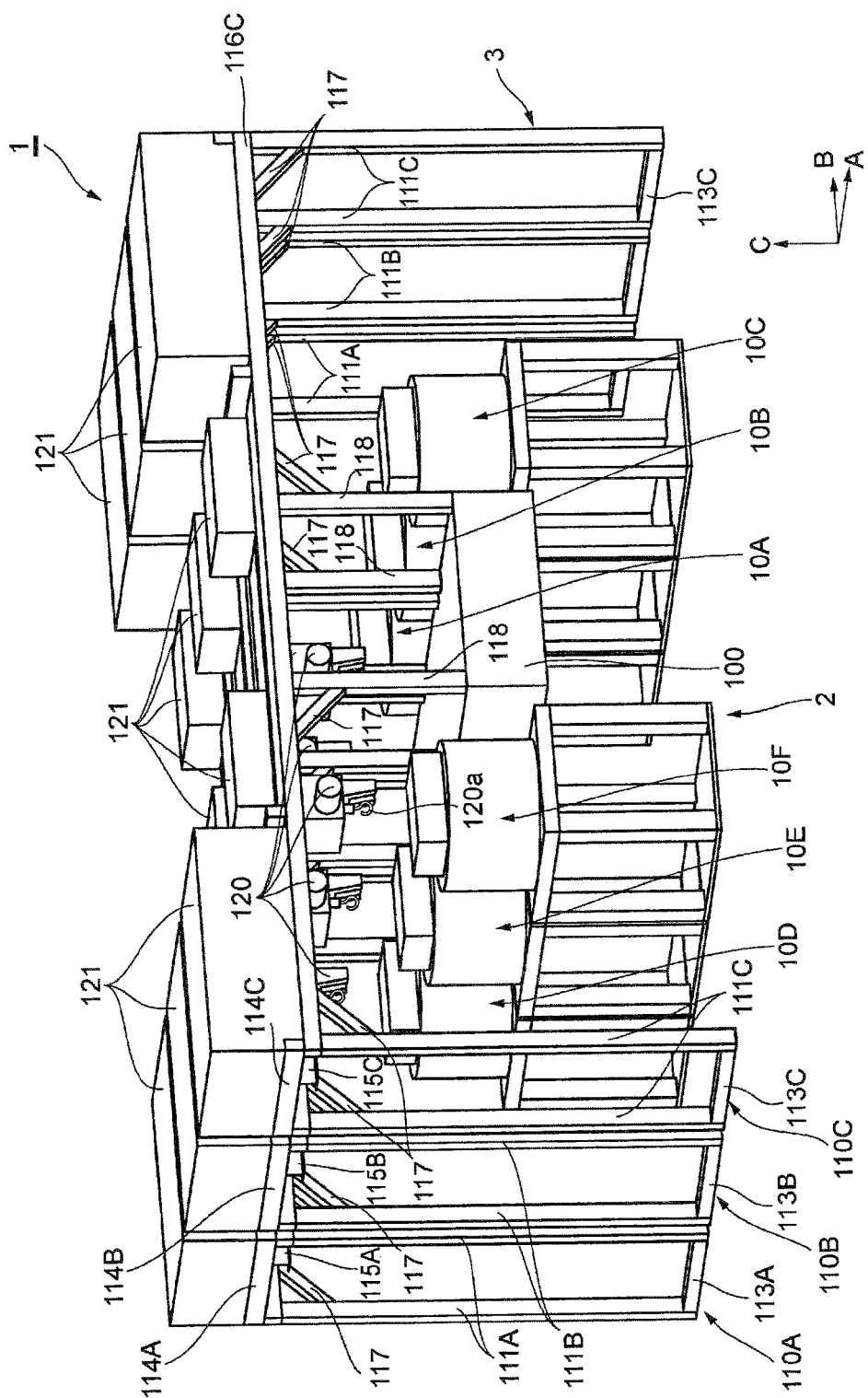
FIG. 1 is a perspective view of a substrate processing apparatus in accordance with an embodiment of the present invention.

Hereinafter, embodiments of the present invention will be described with reference to the accompanying drawings. Like reference numerals will be used for like parts in the description of the drawings, and redundant description will be omitted. Further, size ratios in the drawings may differ from actual ratios.

The substrate processing apparatus in accordance with the present embodiment processes a substrate such as a semiconductor substrate or the like. FIG. 1 is a perspective view of the substrate processing apparatus in accordance with the present embodiment. As shown in FIG. 1, a substrate processing apparatus 1 includes an apparatus part 2 for processing a substrate, and a frame structure 3 provided around the apparatus part 2. Hereinafter, the A direction in the drawing indicates a horizontal direction; the B direction indicates a horizontal direction perpendicular to the A direction; and the C direction indicates a vertical direction.

Figure 2:
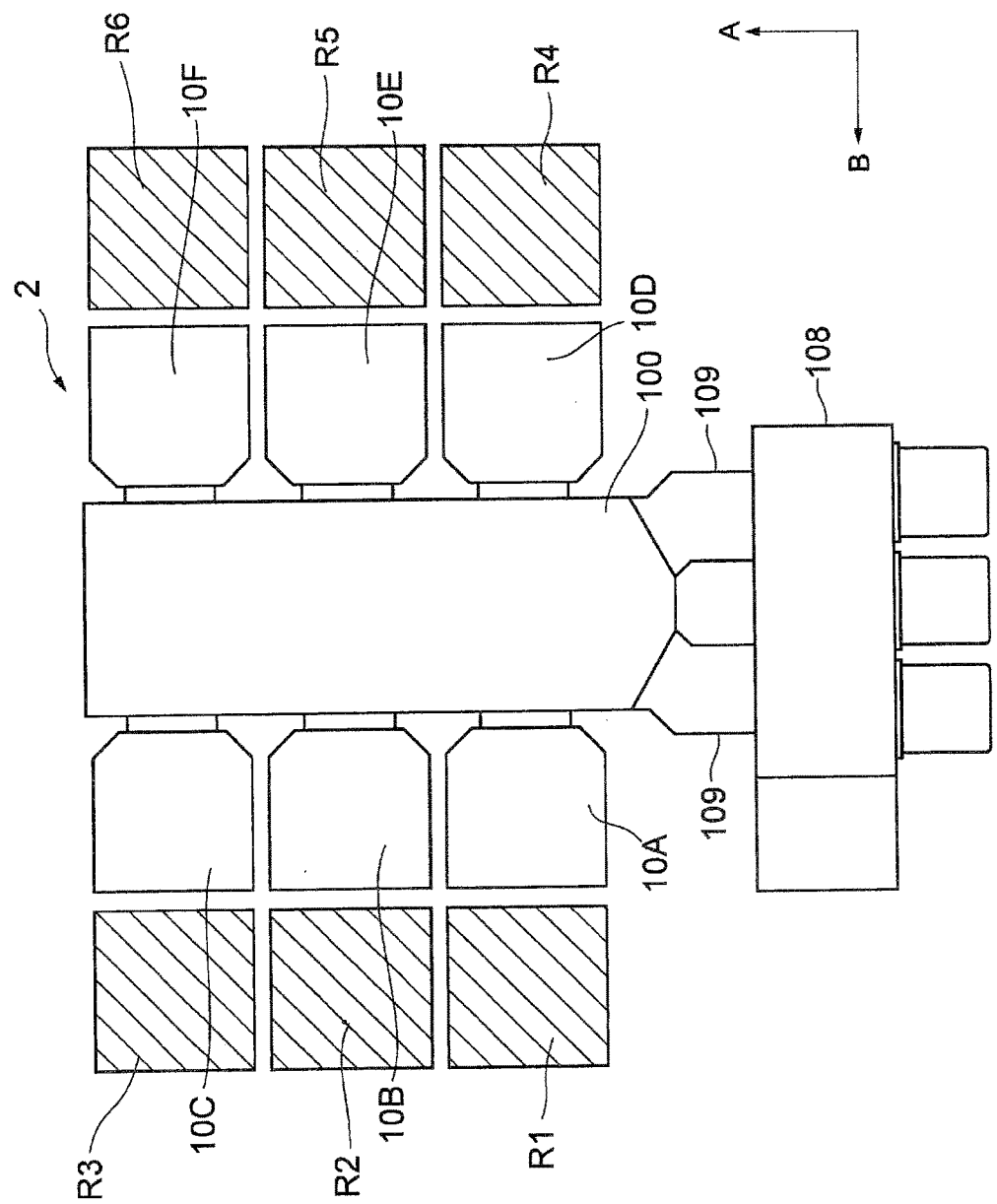
FIG. 2 is a top view of the substrate processing apparatus from which a frame structure is omitted.

First, the apparatus part 2 will be described. FIG. 2 is a top view of the substrate processing apparatus 1 from which the frame structure 3 provided above the substrate processing apparatus 1 is omitted. As shown in FIG. 2, the apparatus part 2 includes a loader module 108, load-lock chambers 109, a transfer chamber 100 and a plurality of processing chambers 10A to 10F. The loader module 108 has therein a transfer robot for transferring a substrate and allows the substrate to be loaded into the substrate processing apparatus 1 from the outside or to be unloaded from the substrate processing apparatus 1 to the outside. The loader module 108 is connected to the load-lock chambers 109. The load-lock chambers 109 which are configured to be vacuum-evacuated are connected to the transfer chamber 100.

The transfer chamber 100 that are configured to be vacuum-evacuated is connected to the processing chambers 10A to 10F. A transfer arm (transfer unit) is disposed in the transfer chamber 100. The transfer arm transfers substrates accommodated in the processing chambers (first processing chamber and second processing chamber) 10A to 10F. The processing chambers 10A to 10F are configured to be vacuum-evacuated and perform various processing on substrates. The processing chambers 10A to 10F are arranged in pairs of two processing chambers facing each other.

Here, the processing chambers 10A and 10D are disposed to face each other with the transfer chamber 100 interposed therebetween. In other words, the processing chambers 10A and 10D are arranged side by side in the B direction in the drawing. In the same manner, the processing chambers 10B and 10E are disposed to face each other with the transfer chamber 100 interposed therebetween. The processing chambers 10C and 10F are disposed to face each other with the transfer chamber 100 interposed therebetween. Although the processing chambers 10A to 10F form a part of processing units for processing a substrate, illustration of equipment connected to the processing chambers 10A to 10F is omitted in FIGS. 1 and 2. The processing units including the processing chambers 10A to 10F may be, e.g., a film forming apparatus, a doping apparatus, an etching apparatus or the like.

In the apparatus part 2 configured as described above, the substrate is loaded into the transfer chamber 100 from the loader module 108 via two load-lock chambers 109 or is unloaded from the transfer chamber 100. Further, the substrate is loaded into the processing chambers 10A to 10F or is unloaded from the processing chambers 10A to 10F by the transfer arm of the transfer chamber 100.

In FIG. 2, maintenance regions (first working space and second working space) R1 to R6 of the processing units including the processing chambers 10A to 10F are ensured for the respective processing chamber 10A to 10F. For example, the maintenance region R1 is positioned near the processing chamber 10A in an arrangement direction of the processing chamber 10A and the transfer chamber 100 (B direction in the drawing). In the same manner, the maintenance regions R2 to R6 are respectively positioned near the processing chambers 10B to 10F corresponding therewith. The maintenance regions R1 to R6 are working spaces where an operator performs maintenance for the insides of the processing chambers 10A to 10F or a lid part to be described later. Therefore, each of the maintenance regions R1 to R6 corresponding to the processing chambers 10A to 10F is wider than at least the lid part of the corresponding processing chamber when seen from the top in the vertical direction (C direction in FIG. 1). In other words, each of the maintenance regions R1 to R6 has an area to accommodate therein at least the lid part of the corresponding processing chamber when seen from the top in the vertical direction.

Figure 3:
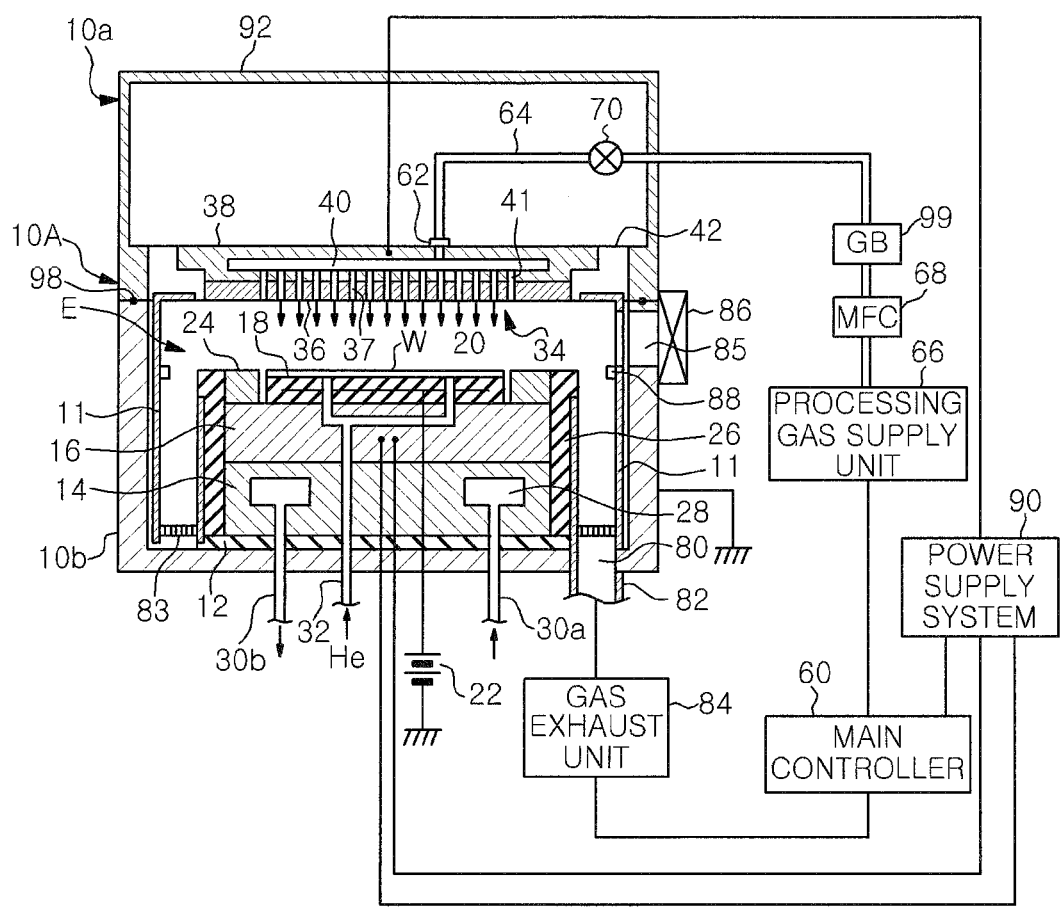
FIG. 3 is a schematic diagram of a processing unit of the substrate processing apparatus.

Next, the processing units will be described in detail. The processing units may have the same configuration. Therefore, hereinafter, a processing unit including the processing chamber 10A will be described as an example. FIG. 3 is a schematic diagram of the processing unit of the substrate processing apparatus 1. Here, the case in which the processing unit is a plasma etching apparatus will be described as an example. The processing unit shown in FIG. 3 is a plasma etching apparatus of a parallel plate type and includes a substantially cylindrical processing chamber 10A. The processing chamber 10A has a surface made of, e.g., an anodically oxidized aluminum. The processing chamber 10A is grounded.

An insulating plate 12 made of ceramic or the like is provided at a bottom portion of the processing chamber 10A. A cylindrical susceptor support 14 is provided on the insulating plate 12. A susceptor 16 made of, e.g., aluminum, is provided on the susceptor support 14. In the present embodiment, the susceptor 16 serves as a lower electrode and also constitutes a mounting table for mounting thereon a semiconductor wafer W as a substrate to be processed. In the plasma etching apparatus, a cylindrical inner wall 26 is provided along side surfaces of the susceptor support 14 and the susceptor 16. The inner wall 26 is made of, e.g., quartz.

An electrostatic chuck 18 for attracting and holding the semiconductor wafer W by an electrostatic force is provided on the top surface of the susceptor 16. The electrostatic chuck 18 has a structure in which an electrode 20 that is a conductive film is interposed between a pair of insulating layers or insulating sheets. A DC power supply 22 is electrically connected to the electrode 20. The electrostatic chuck 18 can attract and hold the semiconductor wafer W thereon by the electrostatic force such as a Coulomb force or the like generated by a DC voltage applied from the DC power supply 22.

A focus ring (calibration ring) 24 is disposed on the top surface of the susceptor 16 to surround the electrostatic chuck 18. The focus ring 24 has a conductive property and may be made of, e.g., silicon. The focus ring 24 can improve etching uniformity.

A coolant channel 28 is provided in the susceptor support 14. A coolant, e.g., cooling water, of a predetermined temperature is supplied through lines 30a and 30b from a chiller unit provided at the outside to be circulated in the coolant channel 28. A temperature of the semiconductor wafer W mounted on the susceptor 16 is controlled by controlling the temperature of the circulating coolant.

The plasma etching apparatus further includes a gas supply line 32. The gas supply line 32 supplies a heat transfer gas, e.g., He gas, from a heat transfer gas supply unit to a gap between the top surface of the electrostatic chuck 18 and the backside of the semiconductor wafer W.

An upper electrode 34 is provided above the susceptor 16 serving as the lower electrode to face the susceptor 16. The susceptor 16 and the upper electrode 34 are disposed in parallel to each other. A processing space E for performing plasma etching on the semiconductor wafer W is formed between the upper electrode 34 and the susceptor 16. The upper electrode 34 has a surface, i.e., a facing surface, which is brought into contact with the processing space E as a plasma generation space while facing the semiconductor wafer W on the susceptor 16 serving as the lower electrode.

The upper electrode 34 is held at a top portion of the processing chamber 10A through an insulating shield member 42. The upper electrode 34 may include an electrode plate 36 and an electrode holder 38. The electrode plate 36 has the surface facing the susceptor 16 and a plurality of gas injection holes 37. The electrode plate 36 may be made of a conductor or a semiconductor of a low resistance with low Joule heating. As will be described later, the electrode 36 may be made of silicon or a silicon containing material such as SiC in view of reinforcing resist.

The electrode holder 38 detachably holds the electrode plate 36 and may be made of a conductive material, e.g., aluminum. The electrode holder 38 has a water cooling structure. A gas diffusion space 40 is formed in the electrode holder 38. A plurality of gas holes 41 communicating with the gas injection holes 37 extends downward from the gas diffusion space 40. Further, a gas inlet 62 for introducing a processing gas into the gas diffusion space 40 is formed in the electrode holder 38. The gas inlet 62 is connected to a gas supply line 64.

The gas supply line 64 is connected to a processing gas supply unit 66. A flow rate controller, e.g., a mass flow controller (MFC) 68, a gas block (GB) 99 and an opening/closing valve 70 are provided in that order from an upstream side in the gas supply line 64. The gas block 99 has a function of blocking a gas passageway during separation (lifting) of a lid part to be described later. The processing gas supply unit 66 supplies an etching gas, e.g., a gas containing fluorocarbon-based gas ($C_xF_y$) such as $C_4F_8$ gas. The processing gas from the processing gas supply unit 66 reaches the gas diffusion space 40 through the gas supply line 64 and is injected to the processing space E through the gas holes 41 and the gas injection holes 37. In other words, the upper electrode 34 serves as a shower head for supplying the processing gas.

The plasma etching apparatus further includes a ground conductor 92. The ground conductor 92 has a substantially cylindrical shape and extends from the sidewall of the processing chamber 10A to a position higher than the height of the upper electrode 34.

The plasma etching apparatus includes a power supply system 90. The power supply system 90 applies a high frequency power to the susceptor 16 as the lower electrode and applies a DC voltage to the upper electrode 34.

In the plasma etching apparatus, a deposition shield 11 is detachably provided along an inner wall of the processing chamber 10A. The deposition shield 11 is also provided at an outer periphery of the inner wall member 26. The deposition shield 11 prevents etching by-products (deposits) from being adhered to the processing chamber 10A. The deposition shield 11 may be formed by coating an aluminum material with ceramic such as $Y_2O_3$ or the like.

At the bottom portion of the processing chamber 10A, a gas exhaust plate 83 is provided between the inner wall member 26 and the inner wall of the processing chamber 10A. The gas exhaust plate 83 may be formed by coating an aluminum material with ceramic such as $Y_2O_3$ or the like. In the processing chamber 10A, a gas exhaust port 80 is provided below the gas exhaust plate 83. A gas exhaust unit 64 is connected to the gas exhaust port 80 through a gas exhaust passage 82. The gas exhaust unit 84 includes a vacuum pump such as a turbo molecular pump or the like, so that a pressure in the processing chamber 10A can be decreased to a desired vacuum level. Further, a loading/unloading port 85 for the semiconductor wafer W is provided at a sidewall of the processing chamber 10A. The loading/unloading port 85 can be opened/closed by a gate valve 86.

A conductive member (GND block) 88 is provided at the inner wall of the processing chamber 10A. The conductive member 88 is attached to the inner wall of the processing chamber 10A to be positioned at the substantially same level as the semiconductor wafer W in the height direction. The conductive member 88 is DC-connected to the ground and prevents abnormal discharge. The conductive member 88 is preferably provided in the plasma generation region, but the installation position thereof is not limited to that shown in FIG. 3. For example, the conductive member 88 may be provided at the susceptor 16 side such as the periphery of the susceptor 16 or the like. Further, the conductive member 88 may be provided near the upper electrode. For example, the conductive member 88 may be provided in a ring shape at an outer side of the upper electrode 34.

The components of the plasma etching apparatus, e.g., a gas supply system, a driving system, the power supply system 90 and the like, are connected to and controlled by a main controller 60 including a microprocessor (computer). The main controller 60 is connected to a user interface including a keyboard that is used for an operator to input commands to manage the plasma etching apparatus, a display for visually displaying an operation state of the plasma etching apparatus and the like.

The main controller 60 is also connected to a storage unit that stores a control program for realizing various processes executed in the plasma etching apparatus under the control of the main controller 60, and programs, i.e., processing recipes, for executing processes of the components of the plasma etching apparatus in accordance with processing conditions. The processing recipe is stored in a storage medium of the storage unit. The storage medium may be a hard disk or a semiconductor memory, or may also be a portable medium such as a CDROM, a DVD, a flash memory or the like. The processing recipe may be appropriately transmitted from another device through, e.g., a dedicated line.

If necessary, a processing recipe may be read out from the storage unit and executed in the main controller 60 in accordance with an instruction from the user interface. Accordingly, a desired process is performed in the plasma etching apparatus under the control of the main controller 60.

Here, the processing chamber 10A is configured to be divided into a lid part 10a and a main body part 10b. The lid part 10a may include, e.g., the upper electrode 34, the insulating shield member 42, the gas supply line 64 and the ground conductor 92. An O-ring 98 is provided at a connection portion of the lid part 10a and the main body part 10b to maintain airtightness in connecting the lid part 10a and the main body part 10b.

Hereinafter, the frame structure 3 will now be described in detail with reference to FIGS. 1 and 4. FIG. 4 is a top view of the frame structure 3. As shown in FIGS. 1 and 4, the frame structure 3 includes frame stands 110A to 110C. Each of the frame stands 110A to 110C is installed to correspond with two processing chambers. In other words, the frame stand 110A is provided to correspond to the processing chambers 10A and 10D. The frame stand 110B is provided to correspond to the processing chambers 10B and 10E. The frame stand 110C is provided to correspond to the processing chambers 10C and 10F. Since the frame stands 110A to 110C have the same structure, the frame stand 110C will be described as an example hereinafter.

The frame stand 110C includes a pair of column parts, and a beam part 115C supported at top portions of the column parts. Each of column parts has two column frames 111C standing upright in the vertical direction (C direction in FIG. 1), a lower frame 113C connecting lower end portions of the two column frames 111C, and an upper frame 114C connecting upper end portions of the two column frames 111C. The column parts are separated from each other in the horizontal direction (B direction in FIGS. 1 and 4) to face each other. A pair of column parts facing each other is arranged such that the processing chamber 10C, the processing chamber 10F and the transfer chamber 100 are disposed therebetween. In other words, the pair of column parts facing each other is arranged in an arrangement direction of the processing chamber 10C, the transfer chamber 100 and the processing chamber 10F (B direction in FIGS. 1 and 4). Further, the pair of column parts facing each other is arranged such that they are respectively separated from the processing chamber 10C and processing chamber 10F. A maintenance region R3 is positioned between the column part and the processing chamber 10C and a maintenance region R6 is positioned between the column part and the processing chamber 10F.

The upper end portions (top portions) of the pair of column parts facing each other are connected by two horizontal frames 116C extending in the arrangement direction of the processing chamber 10C, the transfer chamber 100 and the processing chamber 10F (B direction in FIGS. 1 and 4). Accordingly, a substantially cuboid-shaped frame is formed by the pair of the column parts and the horizontal frames 116C. Each of the horizontal frames 116C may be supported by auxiliary columns 118 which connect middle portion of the horizontal frame to the transfer chamber 100. Further, the connection between the horizontal frames 116C and the column parts may be reinforced by reinforcing members 117.

The beam part 115C extending in the arrangement direction of the processing chamber 10C, the transfer chamber 100 and the processing chamber 10F (B direction in FIGS. 1 and 4) is provided between the horizontal frames 116C. The beam part 115C extends across regions above the processing chamber 10C, the processing chamber 10F and the transfer chamber 100. The beam part 115C also extends to the maintenance regions R3 and R6. Therefore, the beam part 115C extends across regions above the maintenance region R3, the processing chamber 10C, the processing chamber 10F, the transfer chamber 100 and the maintenance region R6.

The beam part 115C has, e.g., a rail. An elevating part 120 is movably coupled to the rail. Since the elevating part 120 has a driving portion self-propelled on the rail, and the elevating part 120 is movable in the horizontal direction (B direction in the FIGS. 1 and 4) along the beam part 115C. Further, the rail may be extended continuously from one end to the other end of the beam part 115C, or may be disconnected at an intermediate portion thereof. The elevating part 120 may be, e.g., a self-propelled crane.

The elevating part 120 has a connection member 120a to be connected to the lid part 10a of the processing chamber 10C or 10F, and an elevation mechanism for lifting the connection member 120a. Therefore, when it is necessary, the connection member 120a is connected to the lid part 10a and the lid part 10a is moved in the vertical direction (C direction in the FIG. 1) by the elevating part 120. Further, the elevating part 120 may be provided for each of the processing chambers 10C and 10F. In this case, the number of elevating parts 120 is determined in accordance with the number of processing chambers. Here, two processing chambers provided, so that the example in which two elevating parts 120 are provided is illustrated. Moreover, one elevating part 120 for lifting the lid part 10a may be used by employing a common connection part of the processing chambers 10C and 10F.

Figure 5A:
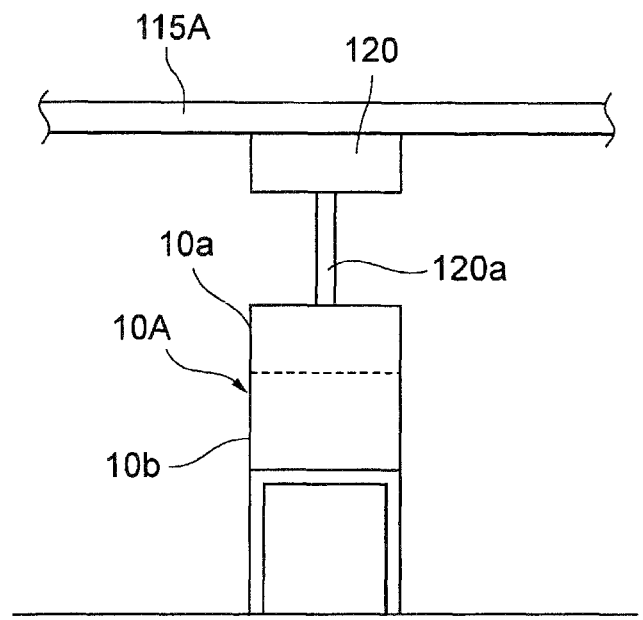
Figure 5B:
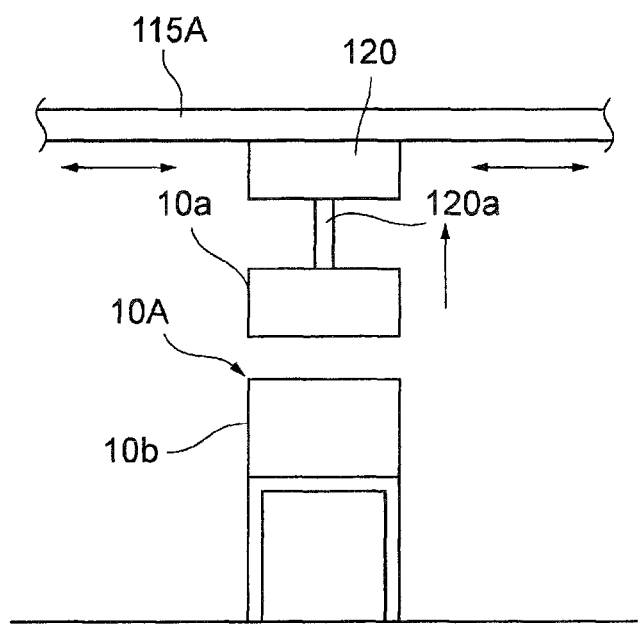

FIGS. 5A and 5B show a modification of the elevating part 120. FIG. 5A shows a state before the lid part 10a is lifted. FIG. 5B shows a state in which the lid part 10a is lifted. In FIGS. 5A and 5B, the processing chamber 10A is presented as an example. The other processing chambers 10B to 10F may have the same configuration. The elevating part 120 in FIGS. 5A and 5B employs a piston as an elevation mechanism. An end portion of the piston extending from a main body of the elevating part 120 is fixed to the lid part 10a. As shown in FIG. 5B, the lid part 10a of the processing chamber 10A can be vertically lifted to be separated from the main body part 10b by extension/contraction of the piston.

Figure 6A:
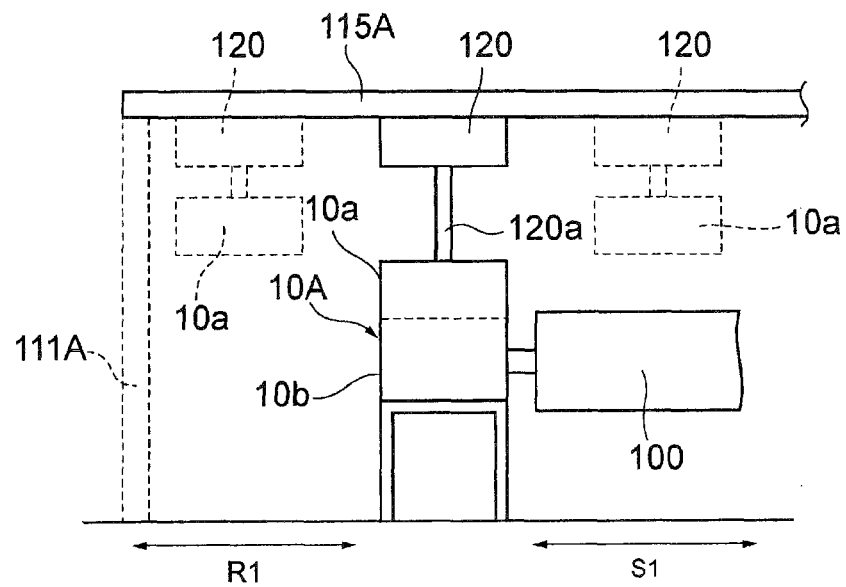
Figure 6B:
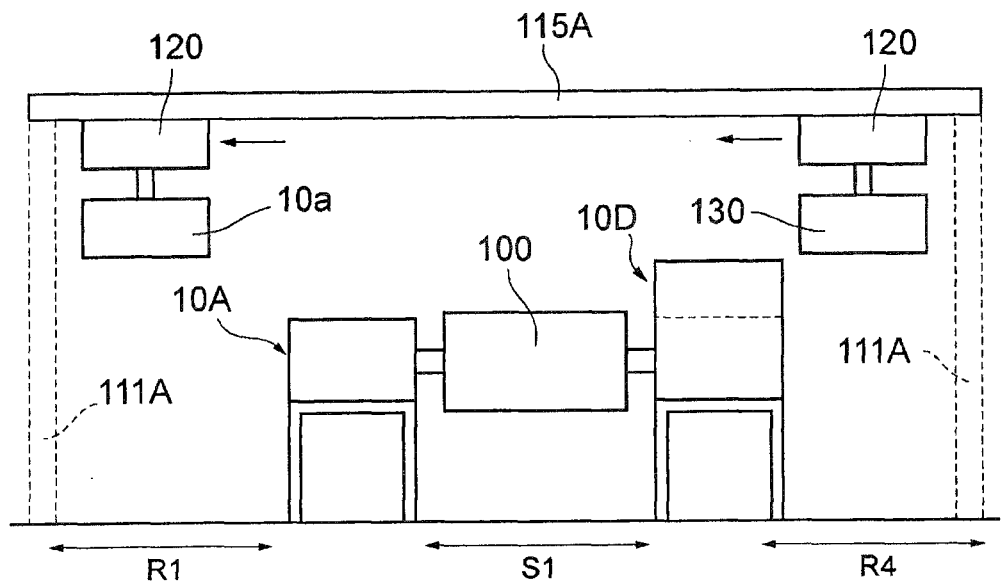

FIGS. 6A and 6B are diagrams schematically explaining a maintenance method. Maintenance items include: checking and controlling the lid part of the processing chamber; cleaning the inside of the processing chamber; cleaning, controlling and replacing components in the processing chamber; and the like. First, the checking and controlling the lid part of the processing chamber will be schematically described. In FIGS. 6A and 6B, the processing chambers 10A and 10D will be described as an example. FIG. 6A is a diagram schematically explaining a moving position of the lid part 10a. The elevating part 120 lifts the lid part 10a and then moves toward the maintenance region R1. The lid part 10a stands by at an upper position in the maintenance region R1. An operator enters the maintenance region R1 and performs the checking and controlling the lid part 10a. The maintenance method is the same when the elevating part 120 is a self-propelled type crane and when the elevating part 120 has a piston.

Next, the cleaning the inside of the processing chamber and the cleaning, controlling and replacing the components in the processing chamber will be described. In this case, the elevating part 120 vertically lifts the lid part 10a and then moves toward the transfer chamber 100. The lid part 10a stands by at an upper position in a region S1 where the transfer chamber 100 is disposed. An operator enters the maintenance region R1 and performs cleaning the inside of the processing chamber or performs cleaning, controlling and replacing components in the processing chamber. This method is employed in the case of replacing a relatively light component because a component to be replaced is transferred by the operator. Further, the maintenance method is the same when the elevating part 120 is a crane and when the elevating part 120 has a piston.

FIG. 6B is a diagram schematically explaining a case of using two elevating parts 120 for the processing chamber 10A, e.g., the case in which the elevating part 120 replaces a component 130 that is relatively heavy in addition to lifting the lid part 10a. As shown in FIG. 6B, when the component 130 is loaded into the processing chamber 10A, one of the two elevating parts 120 vertically lifts the lid part 10a and the lid part 10a stands by at an upper position in the maintenance region R1, and the other elevating part 120 vertically lifts the component 130 in the maintenance region R4 opposite to the maintenance region R1 and moves toward the processing chamber 10A.

In this manner, since two elevating parts 120 are used, a maintenance region set for each of the processing chambers can be used for the counterpart processing chamber, which enables effective utilization of the space. Although the loading of the component is illustrated as an example in FIG. 6B, the unloading of the component can be realized by reverse sequences. The component to be replaced may be a heavy component, e.g., the deposition shield 11, the susceptor 16 or the like. It is difficult for the operator to carry such a component because it becomes heavier as the apparatus is scaled up. By employing this method, the component can be effectively replaced. Further, in this maintenance method, the elevating part 120 for lifting a component is a self-propelled type crane, and the elevating part 120 for lifting the lid part 10a may be a self-propelled type crane or may have a piston.

Figure 7:
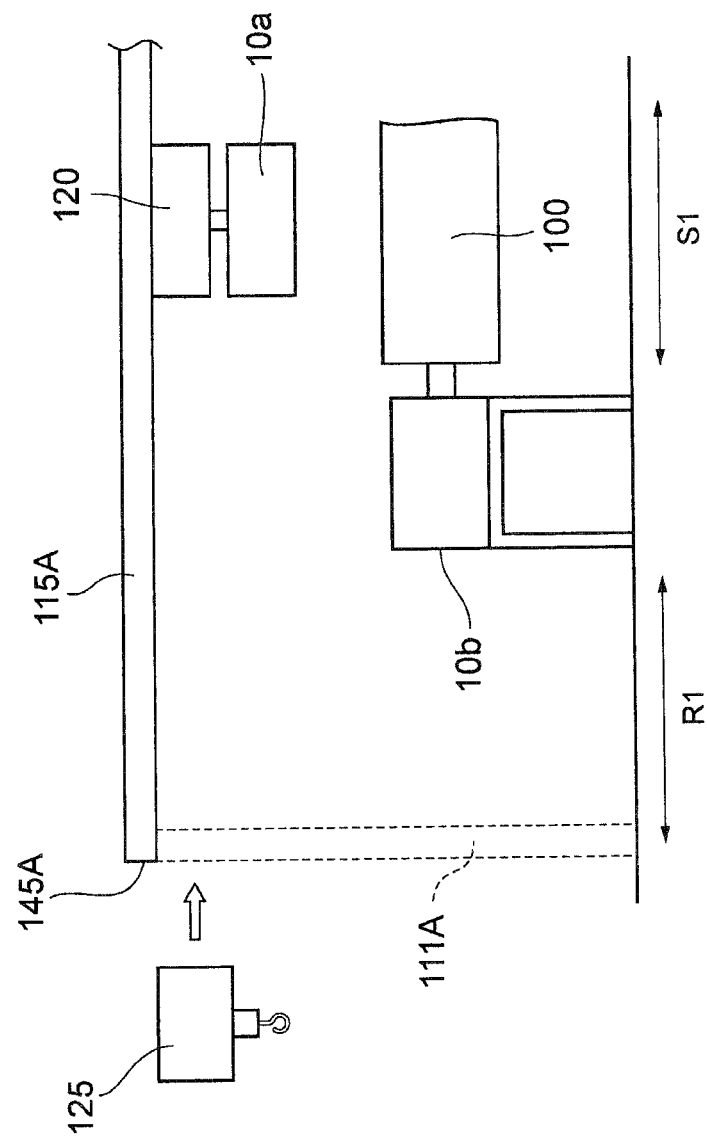
FIG. 7 shows an example in which an auxiliary elevating part is added.

Another example of the maintenance method will be described. As shown in FIG. 7, the end portion of the rail part of the beam part 115A may be configured to receive an auxiliary elevating part 125. In other words, another elevating part may be added to the beam part 115A later. The auxiliary elevating part 125 has the same structure as that of the elevating part 120 and may be, e.g., a self-propelled type crane. As shown in FIG. 6B, in the case of replacing a relatively heavy component 130, the lid part 10a needs to stands by at an upper position in the maintenance region R1. On the other hand, the standby location of the lid part 10a can be changed by using the auxiliary elevating part 125. As shown in FIG. 7, the lid part 10a stands by at an upper position in the region S1 where the transfer chamber 100 is provided and, then, the auxiliary elevating part 125 is coupled to the rail of the beam part 115A so that a component can be loaded/unloaded. The auxiliary elevating part 125 may be provided at an upper position in the maintenance region R1 at all times or before lifting the lid part 10a.

Figure 8:
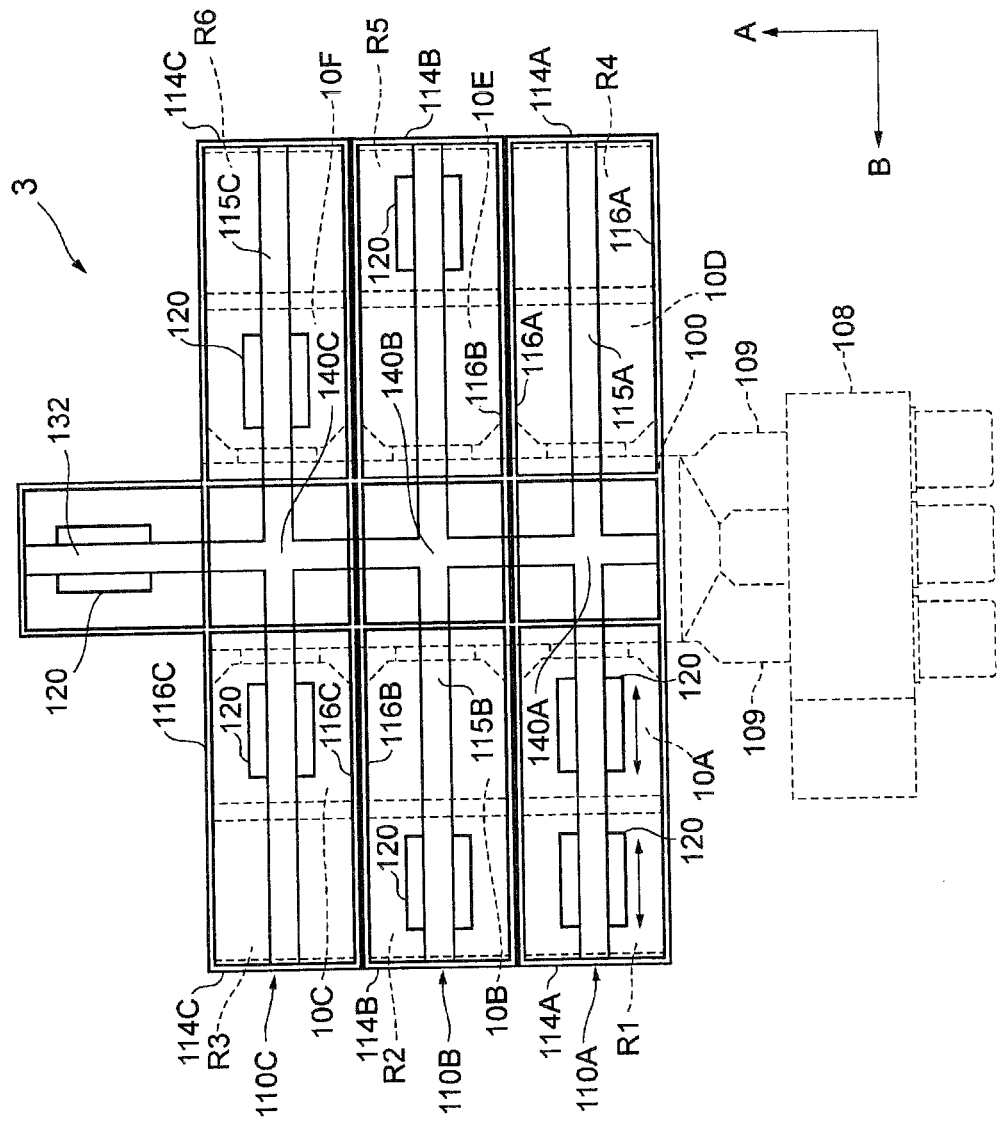
FIG. 8 is a top view of a substrate processing apparatus in accordance with a first modification.

FIG. 8 shows a first modification of the substrate processing apparatus 1. This substrate processing apparatus is different from the substrate processing apparatus 1 shown in FIGS. 1 and 4 in the frame structure 3. As shown in FIG. 8, the frame structure 3 has a beam part 132 extending in a direction perpendicular to the beam parts 115A to 115C (A direction in FIG. 8). The beam part 132 is connected to the beam parts 115A to 115C through connection portions 140A to 140C, respectively. The connection portions 140A to 140C are locations where the elevating parts 120 moving in the B direction in FIG. 8 turn to move in the A direction in FIG. 8. Therefore, the elevating parts 120 can move in the A direction in FIG. 8 as well as in the B direction in the FIG. 8. In this case, a maintenance region preset for each of the processing chambers can be used not only for a processing chamber opposite thereto but also for all the processing chambers, so that the space can be effectively utilized. Further, the maintenance region adjacent to the transfer chamber 100 can also be effectively utilized. In addition, the number of elevating parts 120 can be reduced by sharing the same elevating part 120.

Figure 9:
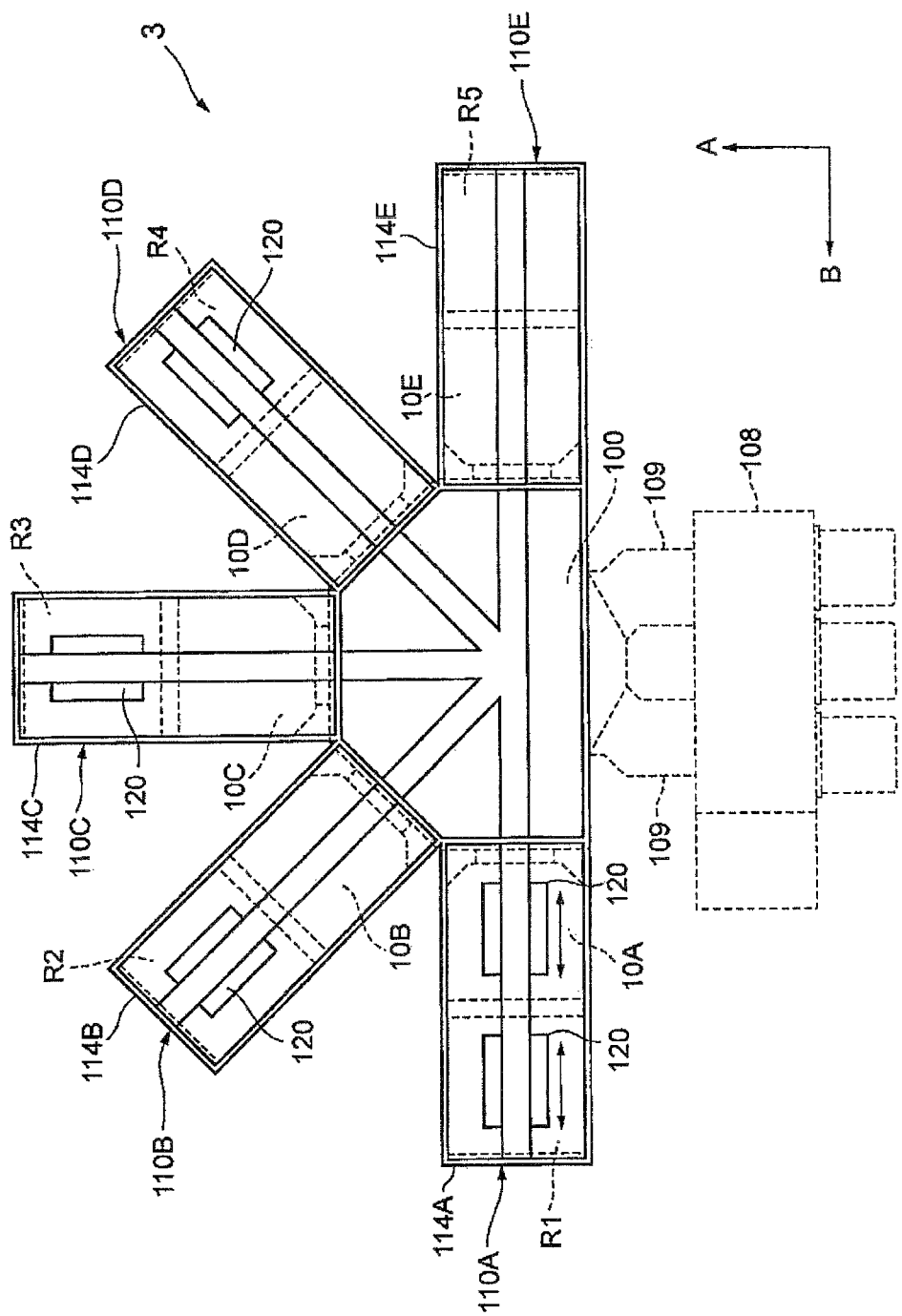
FIG. 9 is a top view of a substrate processing apparatus in accordance with a second modification.

FIG. 9 shows a second modification of the substrate processing apparatus 1. This substrate processing apparatus is different from the substrate processing apparatus 1 shown in FIGS. 1, 4 and 8 in the arrangement of the processing chambers and the structure of the frame structure 3. In FIG. 9, the processing chambers 10A to 10E are arranged around about the transfer chamber 100, and the frame structure 3 is modified in accordance with the arrangement of the processing chambers 10A to 10E. In this case as well, the space including the maintenance regions can be effectively utilized by using the frame structure 3.

In the substrate processing apparatus 1 of the present embodiment, the beam parts 115A to 115C disposed across the processing chambers 10A to 10F are supported by the top portions of the column parts. With this, the elevating parts for lifting the lid part in the vertical direction can be stably held. Further, since the elevating parts are provided at the beam parts to be movable in the horizontal direction, the lid part can be moved to the region above the transfer chamber 100 and the maintenance in the processing chambers 10A to 10F can be performed. The working space of the operator includes a region where the components such as the lid part and the like are made to stand by. The region above the transfer chamber can be utilized as the location where the lid part stands by during the maintenance operation, so that the arrangement space of the substrate processing apparatus which includes the working space can be effectively utilized. If necessary, the elevating parts 120 can be moved toward the maintenance regions R1 to R6 and made to stand by at the upper position therein. Hence, the maintenance of the lid part can be performed in the working space while effectively utilizing the working space.

The above embodiments are examples of the substrate processing apparatus and the maintenance method thereof. However, the present invention can be modified or applied to other apparatuses and methods without being limited to the apparatus and the method of the above embodiments.

For example, although the above embodiment has described an example in which five or six processing chambers are provided, the number of the processing chambers is not limited as long as it is plural.

Further, although the above embodiment has described an etching apparatus specifically as an example of the processing unit, the processing unit may be a film forming apparatus or the like.

DESCRIPTION OF REFERENCE NUMERALS

1 substrate processing apparatus
2 apparatus part
3 frame structure
10A to 10F processing chamber (first processing chamber, second processing chamber)
100 transfer chamber
115A to 115C beam part
120 elevating part
R1-R6 maintenance region (first working space, second working space)

What is claimed is:
1. A substrate processing apparatus comprising:
a first processing chamber including a main body part, a lid part and a processing space formed in the first processing chamber;
a second processing chamber including a main body part, a lid part and a processing space formed in the second processing chamber;
a transfer chamber that is connected to the first processing chamber and the second processing chamber and has therein a transfer unit configured to transfer a substrate accommodated in the first processing chamber or the second processing chamber;
a frame structure including a pair of column parts and a beam part supported at top portions of the column parts; and
at least one elevating part that is coupled to the beam part to be movable in a horizontal direction along the beam part and wherein the at least one elevating part is configured to move the lid part of the first processing chamber or the second processing chamber in a vertical direction,
wherein a first working space for performing maintenance of the first processing chamber is provided adjacent to the first processing chamber in an arrangement direction of the first processing chamber and the transfer chamber,
wherein a second working space for performing maintenance of the second processing chamber is provided adjacent to the second processing chamber in an arrangement direction of the second processing chamber and the transfer chamber, and
wherein the beam part extends across and above the first working space, the first processing chamber, the transfer chamber, the second processing chamber and the second working space.

2. The substrate processing apparatus of claim 1, wherein the first working space has an area, when seen from the vertical direction, to the extent that at least the lid part of the first processing chamber is accommodated therein, and the second working space has an area, when seen from the vertical direction, to the extent that at least the lid part of the second processing chamber is accommodated therein.

3. The substrate processing apparatus of claim 1, wherein the at least one elevating part is coupled to the beam part to be movable above the transfer chamber and at least one of the first working space and the second working space.

4. The substrate processing apparatus of claim 1, wherein the first processing chamber and the second processing chamber are arranged opposite to each other with the transfer chamber interposed therebetween.

5. The substrate processing apparatus of claim 1, wherein the at least one elevating part includes a plurality of elevating parts coupled to the beam part.

6. The substrate processing apparatus of claim 1, further comprising an auxiliary elevating part which is coupled to the beam part to be movable in the horizontal direction along the beam part and is configured to move a component of the first processing chamber or the second processing chamber in the vertical direction.

7. The substrate processing apparatus of claim 1, wherein the at least one elevating part has a connection member to be connected to the lid part and an elevation mechanism for lifting the connection member.

8. The substrate processing apparatus of claim 1, wherein the at least one elevating part has an elevation mechanism which is fixed to the lid part to lift the lid part.

9. A maintenance method of a substrate processing apparatus, the substrate processing apparatus including:
   a first processing chamber including a main body part, a lid part and a processing space formed in the first processing chamber;
   a second processing chamber including a main body part, a lid part and a processing space formed in the second processing chamber;
   a transfer chamber that is connected to the first processing chamber and the second processing chamber and has therein a transfer unit configured to transfer a substrate accommodated in the first processing chamber or the second processing chamber;
   a frame structure including a pair of column parts and a beam part supported at top portions of the column parts; and
   a first elevating part and a second elevating part that are coupled to the beam part to be movable in a horizontal direction along the beam part, and the first elevating part and the second elevating part are configured to move the lid part of the first processing chamber or the second processing chamber in a vertical direction,
   wherein a first working space for performing maintenance of the first processing chamber is provided adjacent to the first processing chamber in an arrangement direction of the first processing chamber and the transfer chamber,
   wherein a second working space for performing maintenance of the second processing chamber is provided adjacent to the second processing chamber in an arrangement direction of the second processing chamber and the transfer chamber, and
   wherein the beam part extends across above the first working space, the first processing chamber, the transfer chamber, the second processing chamber, and the second working space, the method comprising:
   lifting the lid part of the first processing chamber by the first elevating part upon the maintenance of the first processing chamber;
   moving the lid part of the first processing chamber to an upper position in the first working space by the first elevating part;
   lifting a component positioned at the second working space by the second elevating part; and
   moving the component to a region above the first processing chamber by the second elevating part.

10. The substrate processing apparatus of claim 1, wherein the first processing chamber, the transfer chamber and the second processing chamber are positioned directly below the beam part, and
   wherein the at least one elevating part is allowed to move directly above the first processing chamber, the transfer chamber, and the second processing chamber when moving in the horizontal direction.

11. The substrate processing apparatus of claim 1, wherein the frame structure further includes an additional beam part connected to the beam part through a connection portion, and
   wherein the at least one elevating part is allowed to change a moving direction at the connection portion from an extension direction of the beam part to an extension direction of the additional beam part.

12. The substrate processing apparatus of claim 1, further comprising one or more additional processing chambers,
   wherein the first processing chamber, the second processing chamber and the additional processing chambers are arranged circumferentially around the transfer chamber.

13. The substrate processing apparatus of claim 1, wherein the first working space, the first processing chamber, the transfer chamber, the second processing chamber and the second working space are arranged in that order between the column parts.

14. The maintenance method of claim 9, the method further comprising:
   lifting the lid part of the second processing chamber by the second elevating part upon the maintenance of the second processing chamber; and
   moving the lid part of the second processing chamber to an upper position in the second working space by the second elevating part.

15. The substrate processing apparatus of claim 1, wherein the beam part has a straight shape.

16. The maintenance method of claim 9, wherein the frame structure further includes an additional beam part connected to the beam part through a connection portion, and
   the first and the second elevating part are allowed to change a moving direction at the connection portion from an extension direction of the beam part to an extension direction of the additional beam part.

17. The maintenance method of claim 9, wherein the beam part has a straight shape.

* * * * *